United States Patent
Makley et al.

(10) Patent No.: US 6,881,265 B2
(45) Date of Patent: Apr. 19, 2005

(54) GREASE REWORK APPLICATOR

(75) Inventors: Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 499 days.

(21) Appl. No.: 10/122,253

(22) Filed: Apr. 12, 2002

(65) Prior Publication Data

US 2003/0194483 A1 Oct. 16, 2003

(51) Int. Cl.⁷ .................................................. B05C 1/00
(52) U.S. Cl. ........................ 118/211; 118/213; 361/705; 361/707
(58) Field of Search ........................... 118/211, 213, 118/504, 505, 407; 361/704, 705, 707, 708, 710; 257/706, 707, 712, 713, 718, 719; 174/16.3; 165/80.3, 80.2

(56) References Cited

U.S. PATENT DOCUMENTS

| | | | |
|---|---|---|---|
| 4,978,638 A | * | 12/1990 | Buller et al. .................. 29/825 |
| 5,182,632 A | * | 1/1993 | Bechtel et al. ............... 257/713 |
| 5,897,917 A | | 4/1999 | Hinshaw et al. ............. 422/258 |
| 5,969,949 A | * | 10/1999 | Kim et al. .................... 361/704 |
| 6,016,006 A | | 1/2000 | Kolman et al. .............. 257/712 |
| 6,143,076 A | | 11/2000 | Rasmussen et al. ......... 118/411 |
| 6,222,264 B1 | | 4/2001 | O'Neal et al. ............... 257/714 |
| 6,292,362 B1 | | 9/2001 | O'Neal et al. ............... 361/687 |
| 6,459,582 B1 | * | 10/2002 | Ali et al. ..................... 361/704 |

* cited by examiner

*Primary Examiner*—Laura Edwards
(74) *Attorney, Agent, or Firm*—Richard F. Frankeny; Winstead Sechrest & Minick P.C.; Martin McKinley

(57) ABSTRACT

A grease applicator is assembled from three parts, a base unit, a cap unit and a slider unit. The base unit has tenons that couple with corresponding slots in the cap unit to form a cavity with a window opening on a first surface and a slider opening on a second surface where a plane parallel to the second surface is perpendicular to a plane parallel to the first surface. A slider unit is inserted into the slider opening and forms a top surface to the window opening and forming a window cavity for containing a predetermined amount and volumetric shape of grease. The grease applicator is applied to a heat sink with the grease in the window cavity contacting a surface of the heat sink. The slider unit is extracted while pressure is applied to a surface of the grease applicator applying a uniform volume of grease.

7 Claims, 8 Drawing Sheets

GREASE REWORK APPLICATOR

TECHNICAL FIELD

The present invention relates in general to methods and apparatus for applying a controlled thickness of semi-viscous material to a surface.

BACKGROUND INFORMATION

The power density and thermal specification of present high performance processor integrated circuits (ICs) has been driving up the cost and performance of their corresponding heat sink assemblies. As a result, heat sink technology as well as the thermal interface material required between the heat sink and a corresponding integrated circuit have changed. Current thermal solutions used for high performance IC processors require the use of semi-viscous thermal greases to increase thermal conductivity between the IC and its heat sink. These thermal greases create manufacturing problems as well as human factor concerns.

Typically, a heat sink assembly is supplied from a heat sink vendor with a controlled amount of thermal grease applied to the base of the heat sink. The thermal grease may have a specification that requires the thickness of the thermal grease to be 0.005 inch thick with a variation of plus or minus 0.001 inch. The system assembly vendor doing the final board assembly and test would normally attach the heat sink to a corresponding IC. While applying a thickness of thermal grease to the heat sink with high accuracy may be easy to achieve at the heat sink vendor's manufacturing line, any rework required at the system assembly vendor or later in the field makes reproducing the required thermal grease thickness very difficult.

There is, therefore, a need for a method and apparatus that enables a controlled thickness of thermal grease to be applied to a heat sink without resorting to complex equipment or sending the heat sink back to the heat sink vendor for rework.

SUMMARY OF THE INVENTION

A thermal grease applicator comprises sub-unit parts that are coupled together to form a thermal grease carrier. The thermal grease carrier has a base unit for locating a particular applicator to a corresponding particular heat sink design. A cap unit couples to the base and forms a first cavity which has a window opening and a slider opening. A slider unit has a cross-section corresponding to the slider opening and a slider bottom surface that forms the top of a grease cavity within the first cavity. The grease cavity has a cross-section area and a depth corresponding to a volumetric amount of grease to be applied. The grease cavity is filled with thermal grease to a surface of the base unit. The filled thermal grease applicator is placed on a surface of the heat sink so that the grease in the grease cavity contacts the surface. Pressure is applied to the slider unit by pressing on a top surface of the cap unit. While pressure is being applied, the slider is extracted from the slider opening. The slider moves over the top of the thermal grease in the grease cavity and "planes" the grease surface removing any excess thermal grease, smoothing the top surface of the thermal grease and thereby setting the thickness of the thermal grease. The thermal grease applicator is then lifted from the heat sink leaving a controlled volume of thermal grease.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
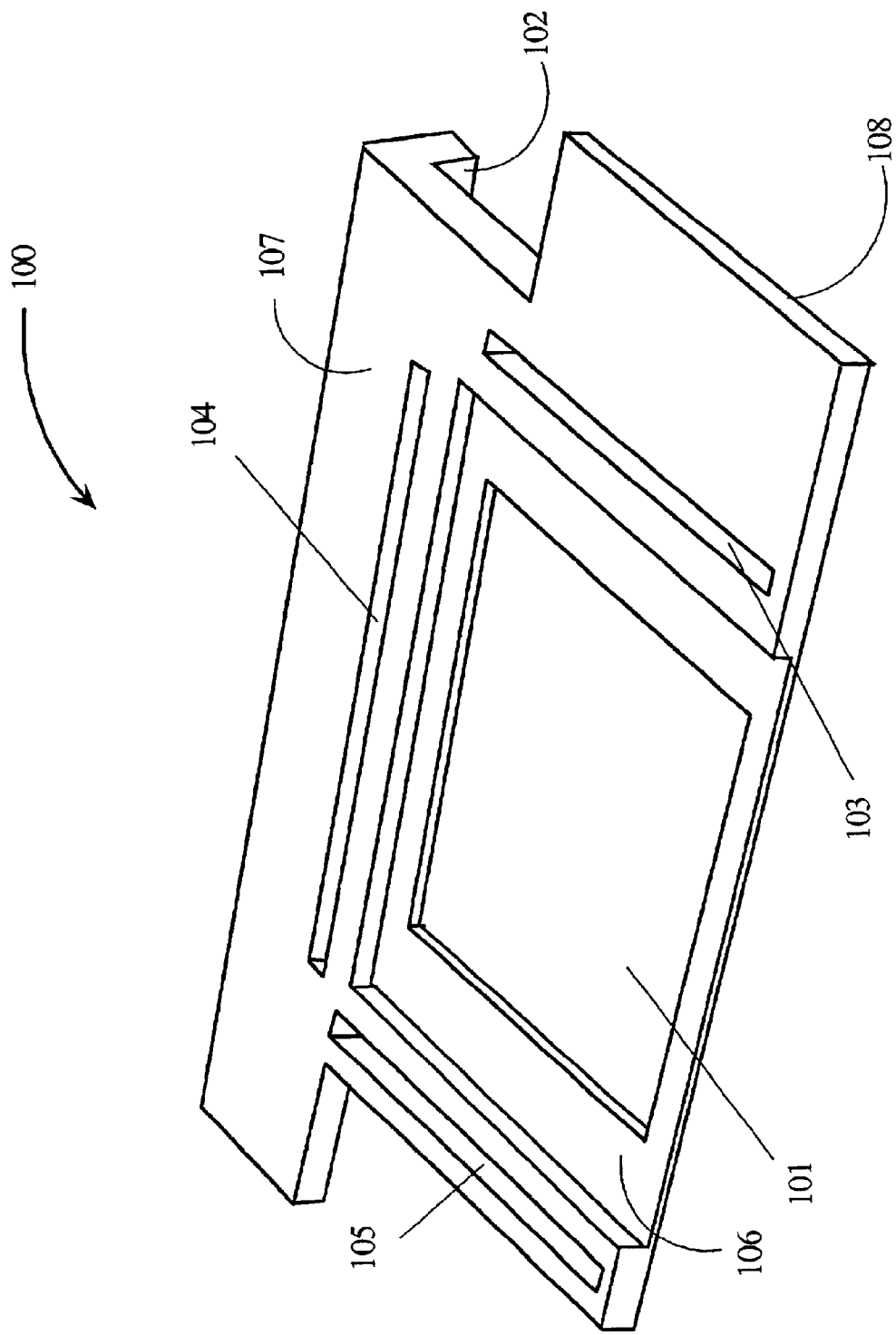
FIG. 1 illustrates a base unit of a grease applicator.

In the following description, numerous specific details are set forth to provide a thorough understanding of the present invention. However, it will be obvious to those skilled in the art that the present invention may be practiced without such specific details. In other instances, well-known processes have been shown in block diagram form in order not to obscure the present invention in unnecessary detail. For the most part, details concerning manufacturing processes and materials composition and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 4:
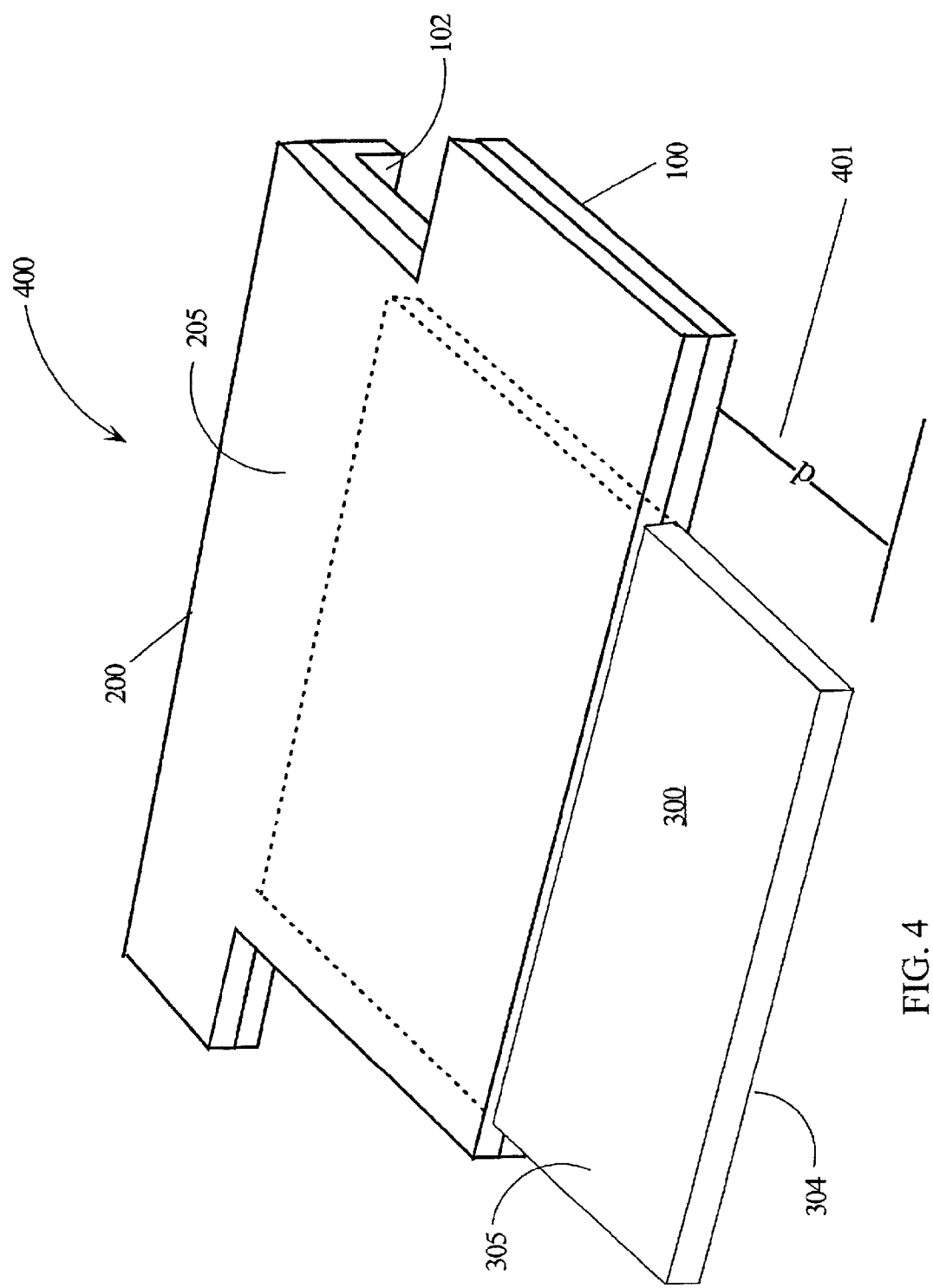
FIG. 4 illustrates the grease applicator with the base unit, cap unit and slider unit coupled together.

FIG. 1 illustrates base unit 100 of the grease applicator 400 (see FIG. 4). Base unit 100 has a window 101 with a predetermined area and depth corresponding to a particular volumetric shaped amount of grease to be applied to a particular heat sink (e.g., heat sink 601, shown in FIG. 6). Base unit 100 has three distinct surfaces, base top surface 107, base bottom surface 108 and cavity bottom surface 106. Base unit 100 also has three locator slots, 103–105. These locating slots match corresponding location tenons 202–204 in the cap unit 200 (see FIG. 2) and are used to locate base unit 100 and cap unit 200 with respect to each other. Extension 102 forms a ledge that is mated to one edge of its matching heat sink and functions to locate window 101 so that the grease will be applied on a particular area of the heat sink surface (e.g., surface 603, shown in FIG. 6). Window 101 has a depth corresponding to the thickness of the material between cavity bottom surface 106 and base bottom surface 108.

Figure 2:
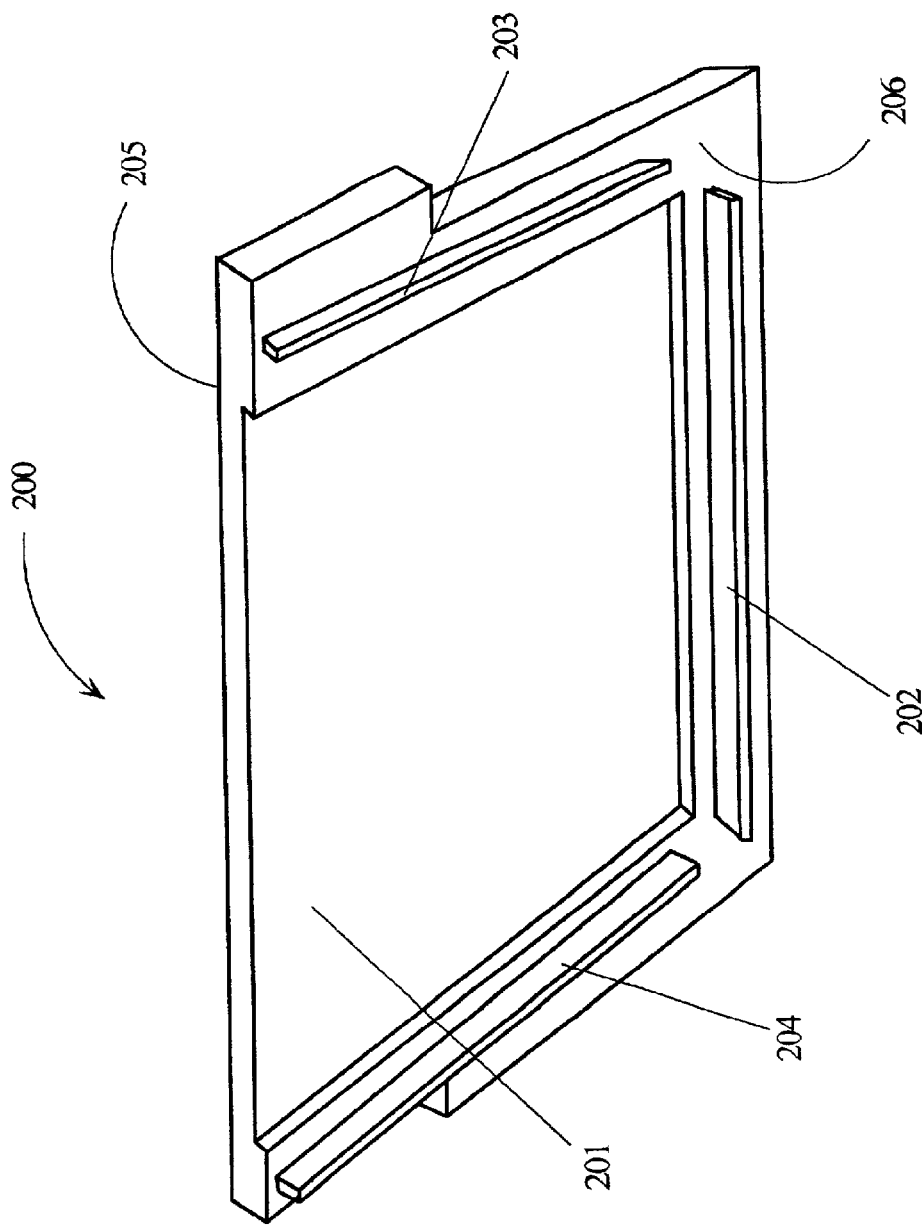
FIG. 2 illustrates a cap unit of a grease applicator.

FIG. 2 illustrates cap 200 which mates with base unit 100. Location tenons 202–204 mate with locator slots 103–105 in base unit 100. Cavity top surface 201 covers window 101 when base unit 100 and cap unit 200 are coupled together with locator tenons 202–204 and corresponding locator slots 103–105. Cap unit 200 has three distinct surface areas, cap top surface 205, cap bottom surface 206 and cavity top surface 201.

Figure 3:
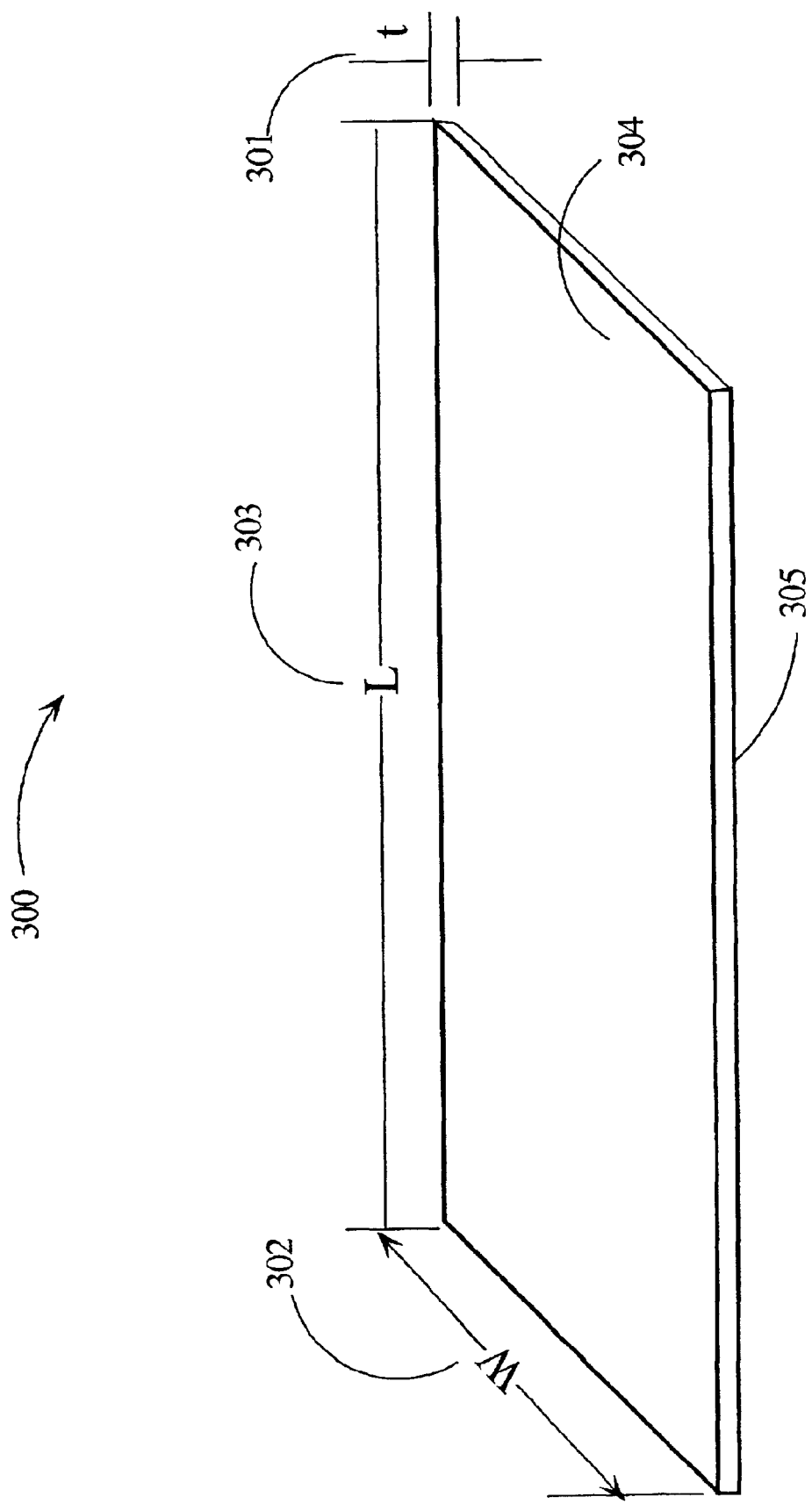
FIG. 3 illustrates a slider unit of a grease applicator.

FIG. 3 illustrates slider unit 300 which has a width 302 and a thickness 301 that corresponds to the cross-section of slider opening 801 (see FIG. 8) formed when base unit 100 and cap unit 200 are coupled together. The length 303 of slider unit 300 is sized so that it extends a distance 401 when inserted as part of grease applicator 400 (see FIG. 4). This enables a user to grasp slider unit 300 and extract it as part of the process of applying grease to a heat sink (e.g., heat sink 601). Slider unit 300 has a slider top surface 305 and a slider bottom surface 304.

FIG. 4 illustrates grease applicator 400 formed by assembling base unit 100, cap unit 200 and slider unit 300. Slider unit 300 extends a distance 401 when inserted in slider opening 701 (see FIG. 7). Extension 102 is also visible in this view. Slider top surface 305 is parallel and adjacent to cavity top surface 201 (not visible in this view) in cap unit 200. Pressure is applied to cap top surface 205 which deflects and applies pressure to slider top surface 305 during the grease application process 800.

Figure 5:
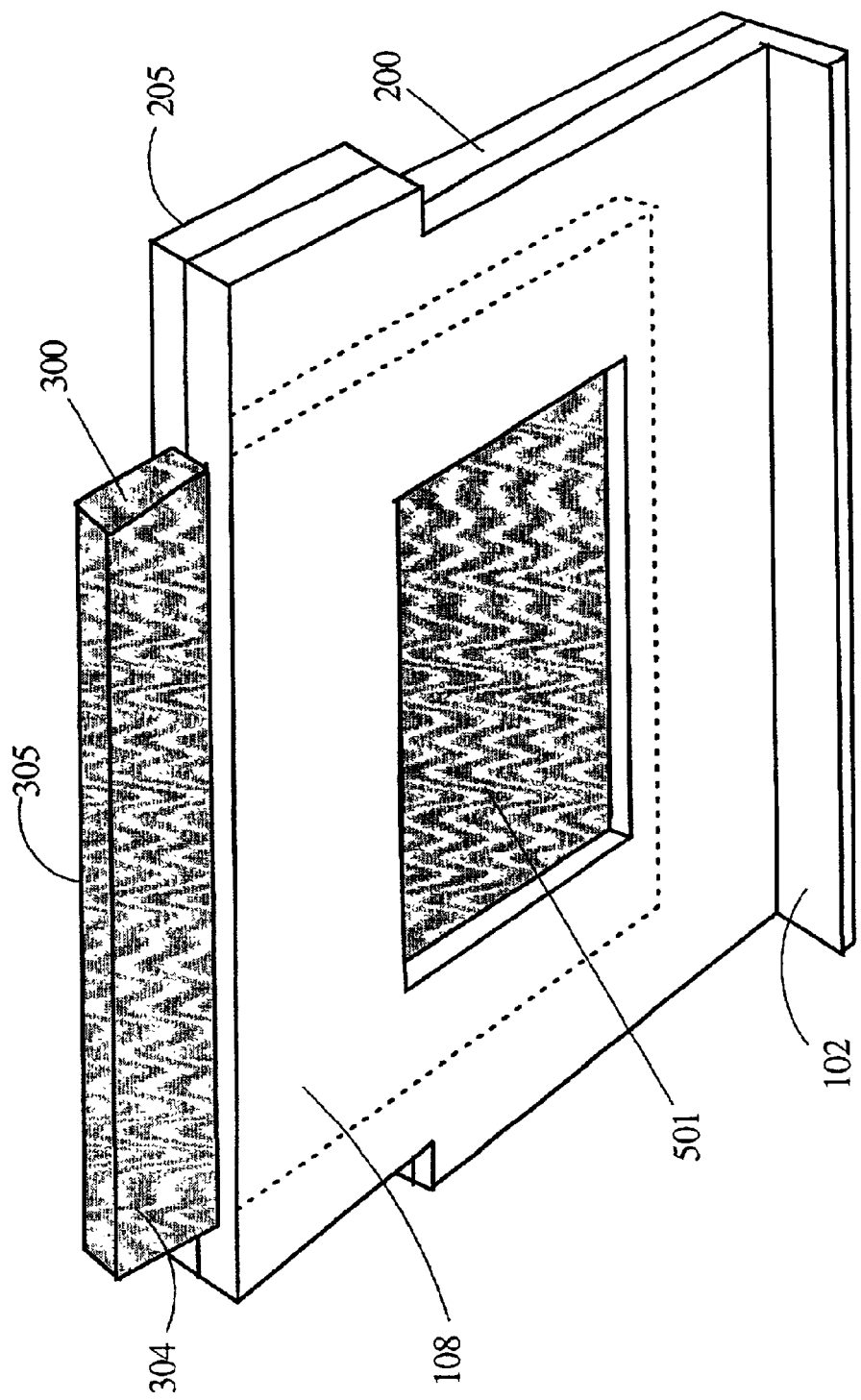
FIG. 5 is a bottom view of a grease carrier showing a grease cavity.

FIG. 5 is a bottom view of assembled grease applicator 400. When base unit 100 and cap unit 200 are coupled together and slider unit 300 is inserted into slider opening 701 (see FIG. 7), a cavity 501 is formed. Slider bottom surface 304 forms the top of the cavity 501. Cavity 501 is filled to base bottom surface 108 with a desired thermal grease. If the thermal grease is to be applied at a later time, a covering or decal may be attached over cavity 501 (when filled with thermal grease). Extension 102 is used to locate grease applicator 400 with respect to a heat sink (e.g., heat sink 601). Cap unit 200 is shown indicating cap top surface 205.

Figure 6A:
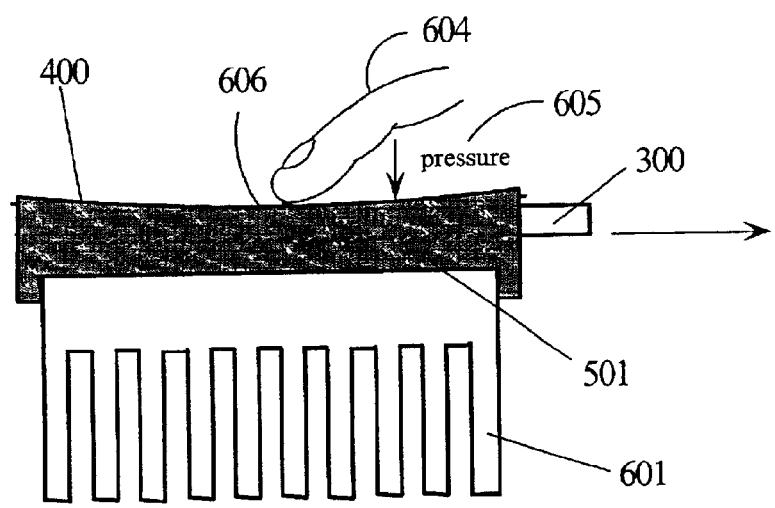
FIG. 6A illustrates a heat sink with a grease applicator attached.
Figure 6B:
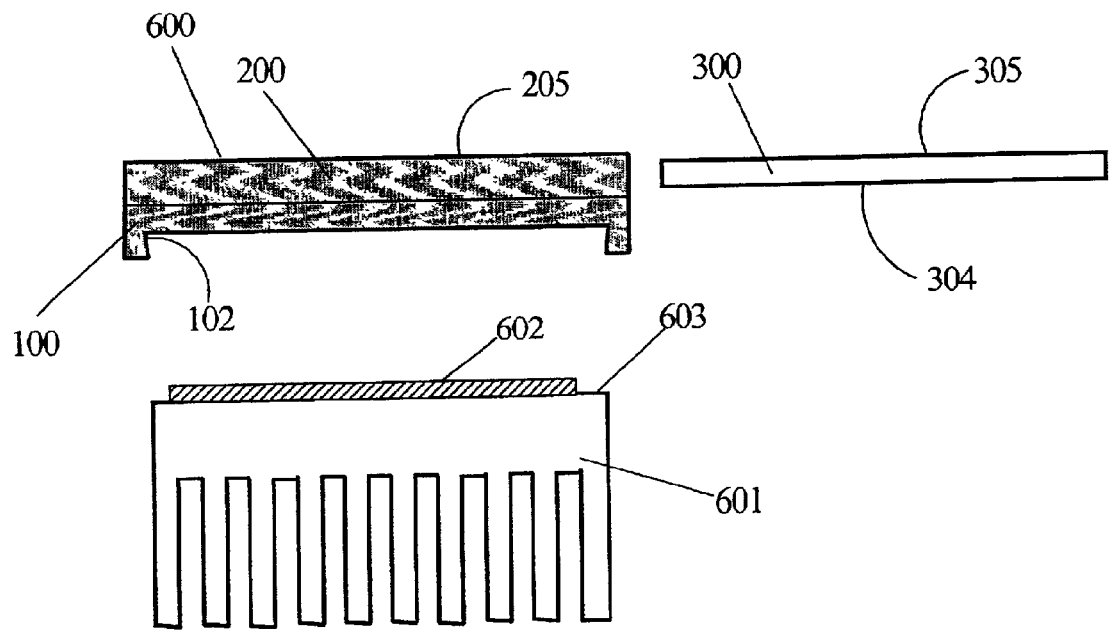
FIG. 6B illustrates the heat sink after the grease applicator has been used to apply a controlled amount of thermal grease.

FIG. 6A is a side view of a heat sink 601 with grease applicator 400 in position for applying grease to surface 603 (see FIG. 6B). Cavity 501, which is hidden, is shown dotted. Pressure 605 is applied to the cap top surface of grease applicator 400 (e.g., with exemplary finger 604). The pressure 605 deflects base top surface 205 and puts pressure on slider top surface 305. This insures that the thermal grease in grease cavity 501 makes good thermal contact with surface 603 of heat sink 601. While pressure 605 is applied, slider unit 300 is extracted from the grease applicator 400. Slider bottom surface 304 moves across the grease in cavity 501 "smoothing" it to a desired thickness defined by the depth of cavity 501. In FIG. 6B, heat sink 601 is shown with a controlled amount of grease 602 on heat sink surface 603. Slider 300 is shown extracted from coupled base unit 100 and cap unit 200, which have been lifted from heat sink 601. Surface 102 engages heat sink 601 to locate grease applicator 400 to heat sink surface 603.

Figure 7:
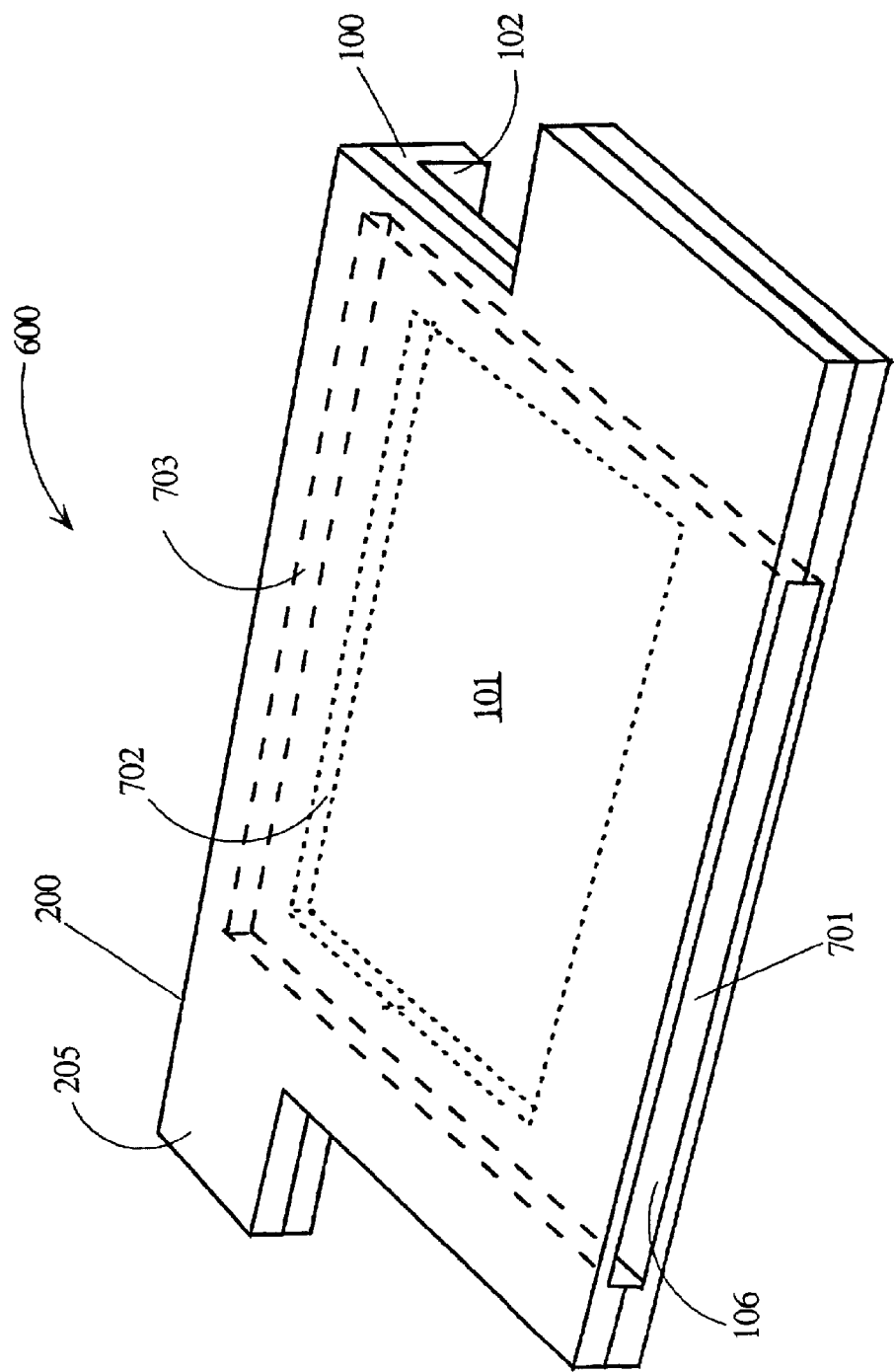
FIG. 7 is another view of the grease carrier showing the cavities when assembled.

FIG. 7 is another view of coupled base unit 100 and cap unit 200 which form grease carrier 600. Slider opening 701 for slider 300 is shown along with base top surface 106. Window 101 has a depth 702 (shown dotted) and slider opening 701 has a height 703 (shown dotted). Extension 102 on base unit 100 is also shown in this view. Cap unit 200 has cap top surface 205 for applying pressure to grease applicator 400 during grease application process 800.

Figure 8:
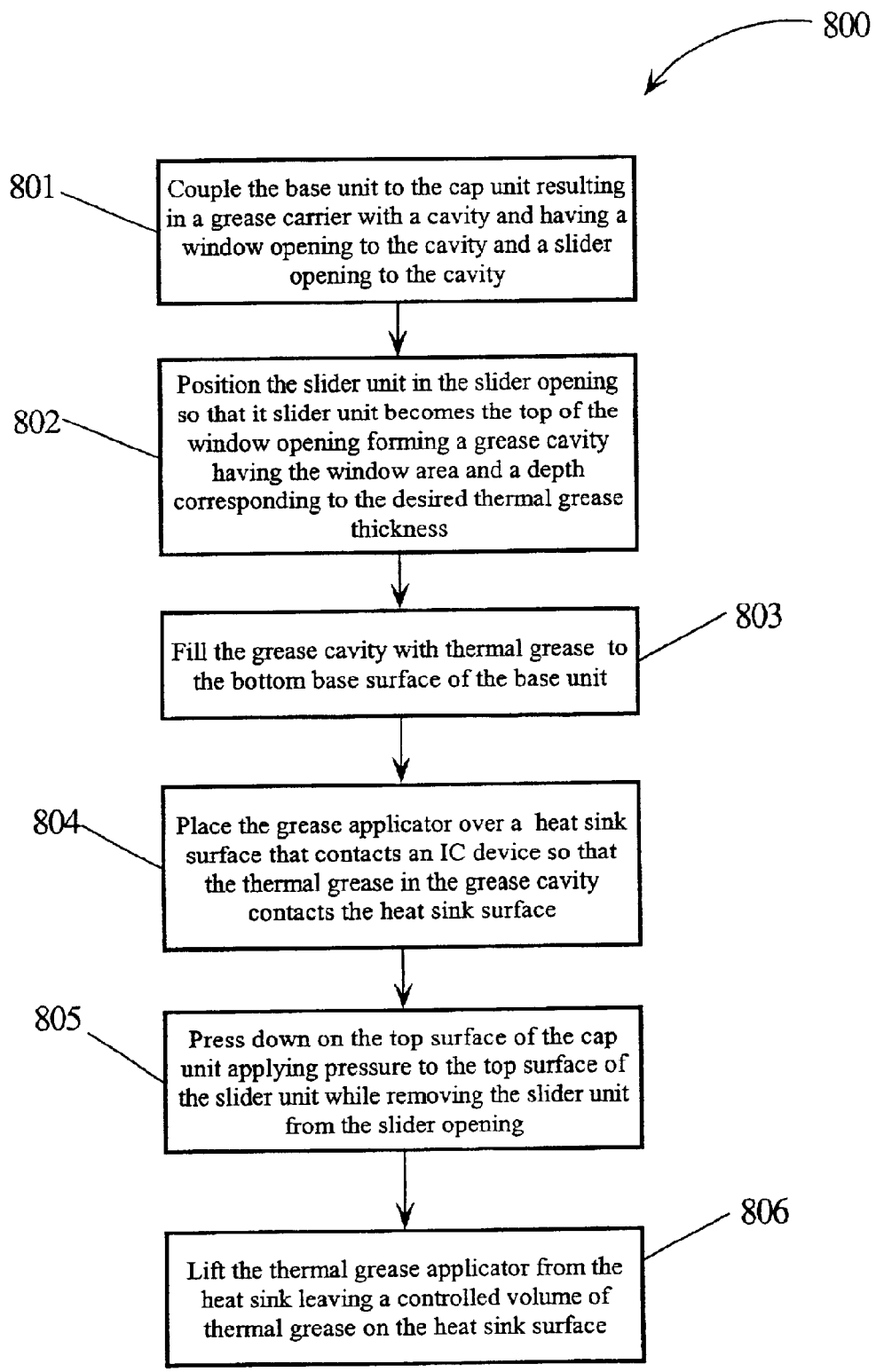
FIG. 8 is a flow diagram of method steps used in embodiments of the present invention.

FIG. 8 is a flow diagram of method steps used in embodiments of the present invention. In step 801, base unit 100 and cap unit 200 are coupled together with tenons 202–204 mating with corresponding slots 103–105 forming grease carrier 600. In step 802, slider unit 300 is inserted in slider opening 701 forming cavity 501. Next in step 803, cavity 501 is filled with the desired grease to the base bottom surface 108. In step 804, grease applicator 400 is positioned over heat sink 601 using extension 102 as a locating edge. In step 805, pressure 605 is applied to cap top surface 205 (e.g., with exemplary finger 604) to insure that the grease makes good contact with surface 603 of heat sink 601. As pressure 605 is applied with exemplary finger 604, slider unit 300 is extracted from grease applicator 400 creating a uniform thickness of grease 602. In step 806, the grease carrier 600 (slider unit 300 has been extracted) is lifted from heat sink 601 leaving a controlled volume of grease 602 with a desired thickness. Any excess grease that remains in base 100 and on slider 300 may be easily wiped clean readying grease applicator 400 for another application process 800.

Although the present invention and its advantages have been described in detail, it should be understood that various changes, substitutions and alterations can be made herein without departing from the spirit and scope of the present invention as defined by the appended claims.

What is claimed is:

1. A grease applicator for applying a controlled volume of grease to a surface comprising:

a grease carrier having a window opening of a predetermined shape and area through a first surface of said grease carrier, said window opening forming an entrance to a cavity, said grease carrier further having a slider opening into said cavity; and a slider unit having a cross-section corresponding to said slider opening and a slider length, said slider unit further having a slider bottom surface, said slider bottom surface forming a top surface to said window opening substantially parallel to said first surface when said slider unit is inserted into said slider opening thereby creating a grease cavity.

2. The grease applicator of claim 1, wherein said grease carrier comprises:

a base unit forming said first surface of said grease carrier, said base unit further having a base top surface substantially parallel to said first surface, a first recess in said base top surface extending a first depth toward said first surface and forming a cavity bottom surface, wherein said window opening extends from said first surface to said cavity bottom surface; and a cap unit having cap top surface, a cap bottom surface and a second recess extending a second depth from said cap bottom surface towards said cap top surface forming a cavity top surface, said base unit and said cap unit coupled together mating said base top surface with said cap bottom surface to form said grease carrier.

3. The grease applicator of claim 2, wherein said slider opening is formed by a cross-section of said first recess and said second recess when said base unit and said cap unit are coupled, said slider opening extending from said cavity bottom surface to said cavity top surface.

4. The grease applicator of claim 2, wherein said base unit has first locators for mating with second locators on said cap unit.

5. The grease applicator of claim 2, wherein said slider unit has a slider top surface substantially parallel to said slider bottom surface, said slider top surface adjacent and parallel to said cavity top surface when said slider unit is inserted in said slider opening.

6. The grease applicator of claim 5, wherein said cap top surface deflects under pressure applying pressure to said slider top surface when said slider unit is inserted in said slider opening.

7. An applicator for applying a controlled amount of semi-viscous material to a plane device surface of a device comprising:

a base unit having a base top surface, a base bottom surface, a first feature for locating said base unit to said device plane surface, a plurality of first locators, a base recess area with a first planar surface at a first depth from said base top surface towards said base bottom surface and a window area within said recess area and extending from said planar surface to said base bottom surface;

a cap unit having cap top surface, a cap bottom surface, second locators for mating with said first locators and a cap recess area with a second planar surface at a second depth from said cap bottom surface towards said cap top surface; and a slider unit having a first cross-section area for inserting in a slider opening formed by said first and second recess areas when said base unit and cap unit are mated with said first and second locators, a slider surface on said slider unit forming a top surface over said window opening when inserted in said slider opening.

* * * * *